United States Patent
Wu (10) Patent No.: US 9,955,597 B1
(45) Date of Patent: Apr. 24, 2018

(54) ELECTRONIC DEVICE AND SUSPENSION MOUNT THEREOF

(71) Applicant: Wistron NeWeb Corp., Hsinchu (TW)

(72) Inventor: Yu-Shuo Wu, Hsinchu (TW)

(73) Assignee: WISTRON NEWEB CORP., Hsinchu (TW)

( * ) Notice: Subject to any disclaimer, the term of this patent is extended or adjusted under 35 U.S.C. 154(b) by 0 days.

(21) Appl. No.: 15/612,127

(22) Filed: Jun. 2, 2017

(30) Foreign Application Priority Data

Oct. 21, 2016 (TW) .............................. 105216078 U (51) Int. Cl.
*H05K 5/02* (2006.01)
*F16M 13/02* (2006.01)

(52) U.S. Cl.
CPC ......... *H05K 5/0204* (2013.01); *F16M 13/027* (2013.01); *F16M 13/02* (2013.01)

(58) Field of Classification Search
CPC .... H05K 5/0204; F16M 13/027; F16M 13/02; F16M 13/022; F16M 11/10; F16M 11/2021; A47F 5/0892; F21V 21/02; Y10T 24/31
See application file for complete search history.

(56) References Cited

U.S. PATENT DOCUMENTS

| 7,374,453 | B1 * | 5/2008 | Allcock | B66C 7/08 439/532 |
| 7,674,129 | B1 * | 3/2010 | Liu | H02B 1/052 361/807 |
| 8,226,433 | B1 * | 7/2012 | Correll | H01R 9/2608 439/532 |
| 8,453,988 | B2 * | 6/2013 | Simpson | E04B 9/006 248/228.3 |
| 9,088,138 | B2 * | 7/2015 | Yu | H02B 1/0526 |
| 9,163,783 | B1 * | 10/2015 | McLaughlin | F16M 13/022 |
| 9,303,811 | B1 * | 4/2016 | Lutz, Jr. | F16M 13/02 |
| 9,485,879 | B2 * | 11/2016 | Molnar | H05K 5/0026 |
| 2010/0038501 | A1 * | 2/2010 | Oh | F16M 11/10 248/201 |
| 2010/0059640 | A1 * | 3/2010 | Helgesen | A47B 81/062 248/205.1 |
| 2010/0285690 | A1 * | 11/2010 | Molnar | H01R 9/2608 439/532 |

(Continued)

*Primary Examiner* — Steven T Sawyer
*Assistant Examiner* — Sagar Shrestha
(74) *Attorney, Agent, or Firm* — McClure, Qualey & Rodack, LLP (57) ABSTRACT

A suspension mount for suspending an electronic device is provided. The suspension mount includes a body, a first elastic unit and a second elastic unit. The body includes a first fastening portion and a second fastening portion. The first fastening portion faces a first direction. The second fastening portion faces a second direction, wherein the first direction is opposite to the second direction. The first elastic unit corresponds to the first fastening portion. The first elastic unit includes a first abutting portion and a second abutting portion. The first abutting portion is located between the second abutting portion and the first fastening portion. The second elastic unit corresponds to the second fastening portion. The second elastic unit includes a third abutting portion and a fourth abutting portion. The third abutting portion is located between the fourth abutting portion and the second fastening portion.

16 Claims, 11 Drawing Sheets

(56) References Cited

U.S. PATENT DOCUMENTS

| | | | |
|---|---|---|---|
| 2010/0309615 A1* | 12/2010 | Grey | F16M 11/10 361/679.01 |
| 2010/0314522 A1* | 12/2010 | Molnar | H02B 1/052 248/346.06 |
| 2011/0011996 A1* | 1/2011 | Cheng | F16M 11/041 248/216.4 |
| 2011/0133050 A1* | 6/2011 | Eisenberger, Sr. | E05B 73/0082 248/551 |
| 2011/0174939 A1* | 7/2011 | Taylor | F16M 11/10 248/201 |
| 2012/0255919 A1* | 10/2012 | Jones | F16M 11/10 211/26 |
| 2013/0033801 A1* | 2/2013 | Hari | H05K 5/0017 361/679.01 |
| 2014/0021312 A1* | 1/2014 | Nguyen | F16M 11/10 248/205.1 |
| 2014/0021315 A1* | 1/2014 | Johnson | A47F 5/0006 248/276.1 |
| 2014/0117186 A1* | 5/2014 | Govindasamy | F16M 11/16 248/317 |
| 2017/0065077 A1* | 3/2017 | Behroozi | A47B 23/043 |

* cited by examiner

ELECTRONIC DEVICE AND SUSPENSION MOUNT THEREOF

CROSS REFERENCE TO RELATED APPLICATIONS

This Application claims priority of Taiwan Patent Application No. 105216078, filed on Oct. 21, 2016, the entirety of which is incorporated by reference herein.

BACKGROUND OF THE INVENTION

Field of the Invention

The present invention relates to a suspension mount, and in particular to the suspension mount adapted to be affixed to ceiling structures of different shapes.

Description of the Related Art

Wireless routers and other electronic devices are commonly affixed to the ceiling by a suspension mount. The conventional suspension mount is affixed to the metal frame of the ceiling. The metal frame can be T-shaped beam or another metal structure. However, there are many different metal frames of different structures, and one single conventional suspension mount cannot be adapted to be affixed to the metal frames of each of the different structures.

BRIEF SUMMARY OF THE INVENTION

In one embodiment, a suspension mount is provided. The suspension mount is for suspending an electronic device and at least applicable to a first ceiling structure and a second ceiling structure, each of the first ceiling structure and the second ceiling structure having a first side, a second side and a central rib located between the first side and the second side. The suspension mount comprises a body, a first elastic unit and a second elastic unit. The body comprises a first fastening portion and a second fastening portion. The first fastening portion extends toward a first direction. The second fastening portion extends toward a second direction, wherein the first direction is opposite to the second direction. The first elastic unit is disposed on the body and corresponding to the first fastening portion, wherein the first elastic unit comprises a first abutting portion and a second abutting portion, the first abutting portion is located between the second abutting portion and the first fastening portion. The second elastic unit is disposed on the body and corresponding to the second fastening portion, wherein the second elastic unit comprises a third abutting portion and a fourth abutting portion, and the third abutting portion is located between the fourth abutting portion and the second fastening portion.

In another embodiment, a suspension mount is provided. The suspension mount is for suspending an electronic device and at least applicable to a first ceiling structure, a second ceiling structure, and a third ceiling structure, each of the first, the second, and the third ceiling structure having a first side, a second side and a central rib located between the first side and the second side. The suspension mount comprises a body, a first elastic unit and a second elastic unit. The body comprises a first fastening portion and a second fastening portion. The first fastening portion extends toward a first direction. The second fastening portion extends toward a second direction, wherein the first direction is opposite to the second direction. The first elastic unit is disposed on the body and corresponding to the first fastening portion, wherein the first elastic unit comprises a first abutting portion and a second abutting portion, the first abutting portion is located between the second abutting portion and the first fastening portion. The second elastic unit is disposed on the body and corresponding to the second fastening portion, wherein the second elastic unit comprises a third abutting portion and a fourth abutting portion, and the third abutting portion is located between the fourth abutting portion and the second fastening portion. The body further comprises a recess, a third fastening portion and a fourth fastening portion, the third fastening portion is disposed on a side of the recess, and the fourth fastening portion is disposed on the opposite side of the recess, the suspension mount further comprises a third elastic unit and a fourth elastic unit, the third elastic unit is disposed on the body and corresponds to the third fastening portion, and the fourth elastic unit is disposed on the body and corresponds to the fourth fastening portion.

In another embodiment, an electronic device is provided. The electronic device includes a housing and a suspension mount. The suspension mount is for suspending an electronic device and at least applicable to a first ceiling structure and a second ceiling structure, each of the first ceiling structure and the second ceiling structure having a first side, a second side and a central rib located between the first side and the second side. The suspension mount comprises a body, a first elastic unit and a second elastic unit. The body comprises a first fastening portion and a second fastening portion. The first fastening portion extends toward a first direction. The second fastening portion extends toward a second direction, wherein the first direction is opposite to the second direction. The first elastic unit is disposed on the body and corresponding to the first fastening portion, wherein the first elastic unit comprises a first abutting portion and a second abutting portion, the first abutting portion is located between the second abutting portion and the first fastening portion. The second elastic unit is disposed on the body and corresponding to the second fastening portion, wherein the second elastic unit comprises a third abutting portion and a fourth abutting portion, and the third abutting portion is located between the fourth abutting portion and the second fastening portion.

Utilizing the suspension mount of the embodiment of the invention, the elastic units with stair structures are provided. Therefore, the suspension mount can be affixed to ceiling structures of different shapes.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
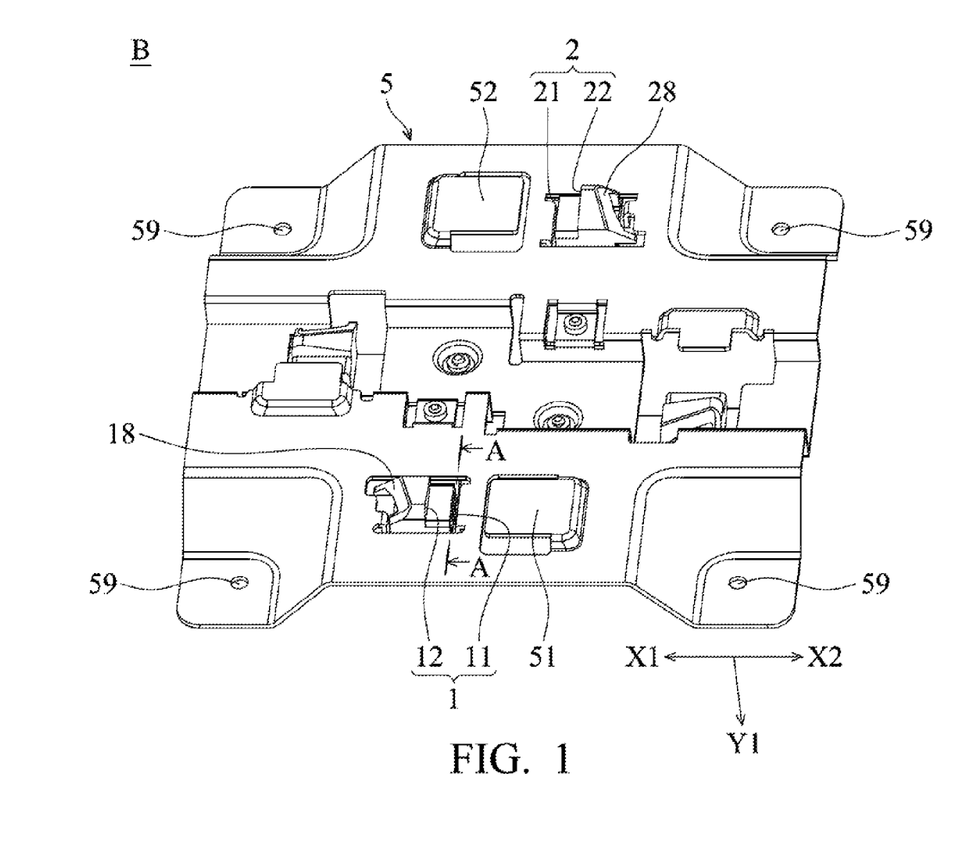
FIG. 1 shows a suspension mount of an embodiment of the invention in one visual angle.

FIG. 1 shows a suspension mount B for suspending an electronic device (not shown) of an embodiment of the invention. The suspension mount B includes a body 5, a first elastic unit 1 and a second elastic unit 2. The body 5 includes at least one connection portion 59, a first fastening portion 51 and a second fastening portion 52. The electronic device is connected to the connection portions 59. In one embodiment, the electronic device is affixed to the connection portions 59 by screws. The electronic device can be a wireless router or another electronic device.

With reference to FIG. 1, the first fastening portion 51 faces a first direction X1. The second fastening portion 52 faces a second direction X2. The first direction X1 is opposite to the second direction X2. In details, the first fastening portion 51 and the second fastening portion 52 are L-shaped. The first fastening portion 51 extends in the first direction X1 form the body 5. The second fastening portion 52 extends in the second direction X2 form the body 5. The first elastic unit 1 and the second elastic unit 2 can be pressed to move downwardly (in a third direction Y1), and can be reset (back to the initial position) while it is released. The first elastic unit 1 is disposed on the body 5 and corresponds to the first fastening portion 51. The first elastic unit 1 comprises a first inclined surface 18, a first abutting portion 11, and a second abutting portion 12. The first abutting portion 11 is located between the second abutting portion 12 and the first fastening portion 51. The second elastic unit 2 is disposed on the body 5 and corresponds to the second fastening portion 52. The second elastic unit 2 comprises a second inclined surface 28, a third abutting portion 21, and a fourth abutting portion 22. The third abutting portion 21 is located between the fourth abutting portion 22 and the second fastening portion 52.

Figure 2A:
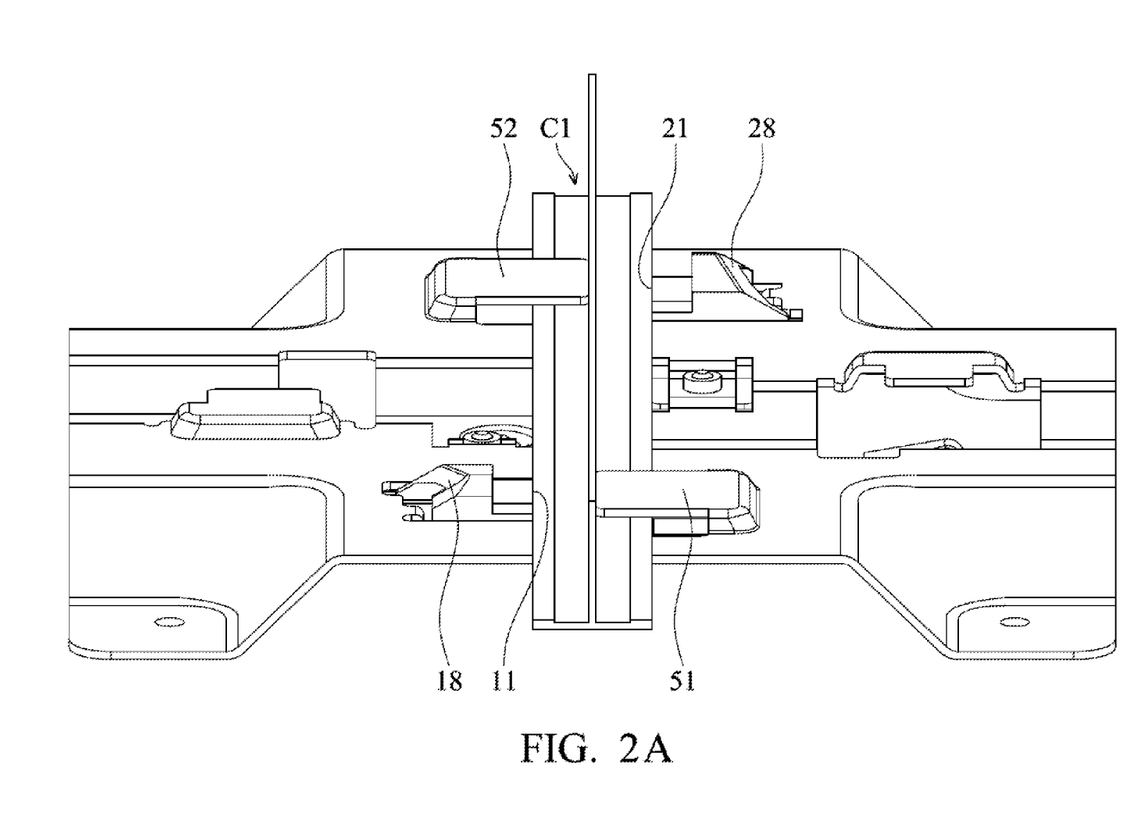
FIG. 2A shows the suspension mount of the embodiment of the invention affixed to a first ceiling structure.
Figure 2B:
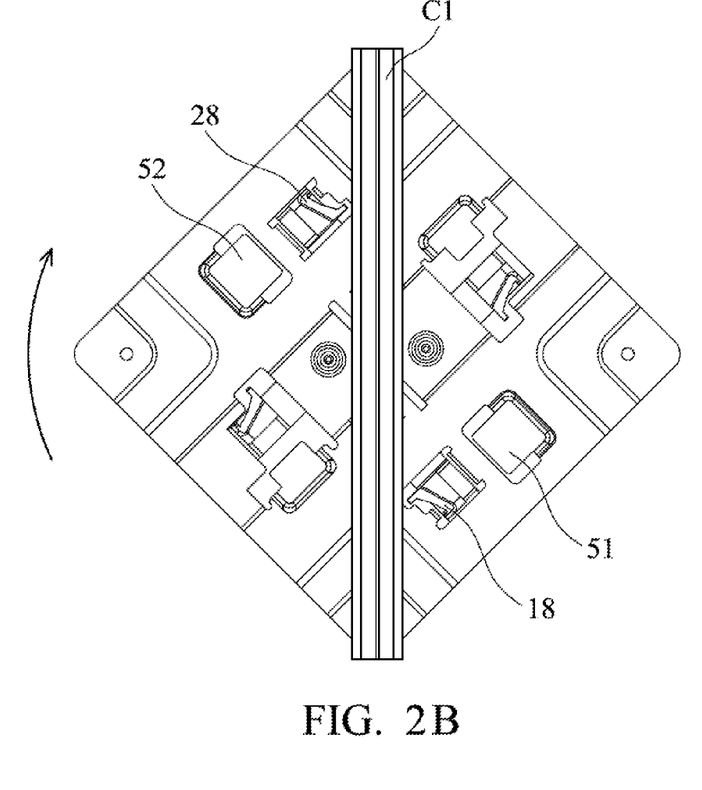
FIG. 2B shows the process of affixing the suspension mount of the embodiment of the invention to the first ceiling structure.
Figure 3:
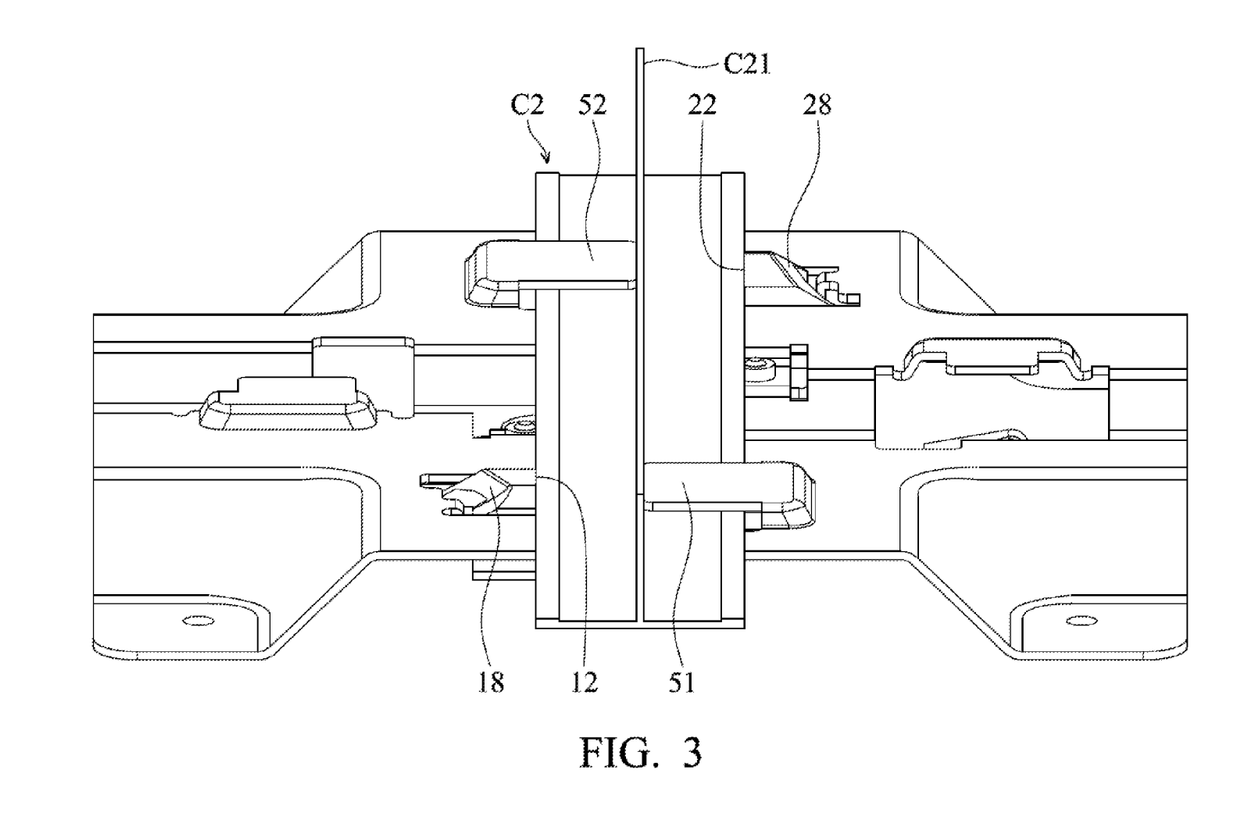
FIG. 3 shows the suspension mount of the embodiment of the invention affixed to a second ceiling structure.

A height difference is formed between the first abutting portion 11 and the second abutting portion 12, and between the third abutting portion 21 and the fourth abutting portion 22. In one embodiment, the suspension mount is selectively connected to a first ceiling structure C1 or a second ceiling structure C2. With reference to FIG. 2A, when the suspension mount is connected to the first ceiling structure C1, the first ceiling structure C1 is sandwiched between the first abutting portion 11 and the first fastening portion 51, and the first ceiling structure C is also sandwiched between the third abutting portion 21 and the second fastening portion 52. With reference to FIG. 2B, the suspension mount may be easily assembled to the first ceiling structure C1 by simply rotating the suspension mount relative to the first ceiling structure. Specifically, firstly the body 5 is held to be close to the first ceiling structure C1. Next, while rotating the body 5 relative to the first ceiling structure C1, the first ceiling structure C1 will be moved along the first inclined surface 18 and the second inclined surface 28 respectively toward the second abutting portion 12 and the third abutting portion 21 to apply pressing force to the first elastic unit 1 and the second inclined surface 28 thereby moving the first elastic unit 1 and the second elastic unit 2 downward (in the third direction Y1). When the body 5 reaches a locking position, which means that a side of the first ceiling structure C1 abuts against the first fastening portion 51, and the other side of the first ceiling structure C1 abuts against the second fastening portion 52, the first elastic unit 1 and the second elastic unit 2 are reset (back to the initial position), the side of the first ceiling structure C1 abuts the third abutting portion 21, and the other side of the first ceiling structure C1 abuts the first abutting portion 11. The first ceiling structure C1 is thereby sandwiched between the first abutting portion 11 and the first fastening portion 51, and the third abutting portion 21 and the second fastening portion 52 to be affixed. With reference to FIG. 3, when the suspension mount is assembled to the second ceiling structure C2, the second ceiling structure C2 is sandwiched between the second abutting portion 12 and the first fastening portion 51, and the second ceiling structure C2 is also sandwiched between the fourth abutting portion 22 and the second fastening portion 52. Meanwhile, t the second ceiling structure C2 is located above the first abutting portion 11 and the third abutting portion 21.

In the embodiment of FIGS. 2A, 2B, and 3, the elastic unit (for example, the first elastic unit) has a stair structure (for example, the first abutting portion and the second abutting portion). Therefore, the suspension mount can be affixed to ceiling structures of different shapes. Although in the embodiment, two ceiling structures of different dimensions are described as examples, the disclosure is not meant to restrict the invention. The number of the stairs can be modified, and the suspension mount can be affixed to the ceiling structures of more than three different dimensions.

With reference to FIG. 3, in one embodiment, the second ceiling structure C2 a central rib C21, and the first fastening portion 51 and the second fastening portion 52 abut the central rib C21.

Figure 4:
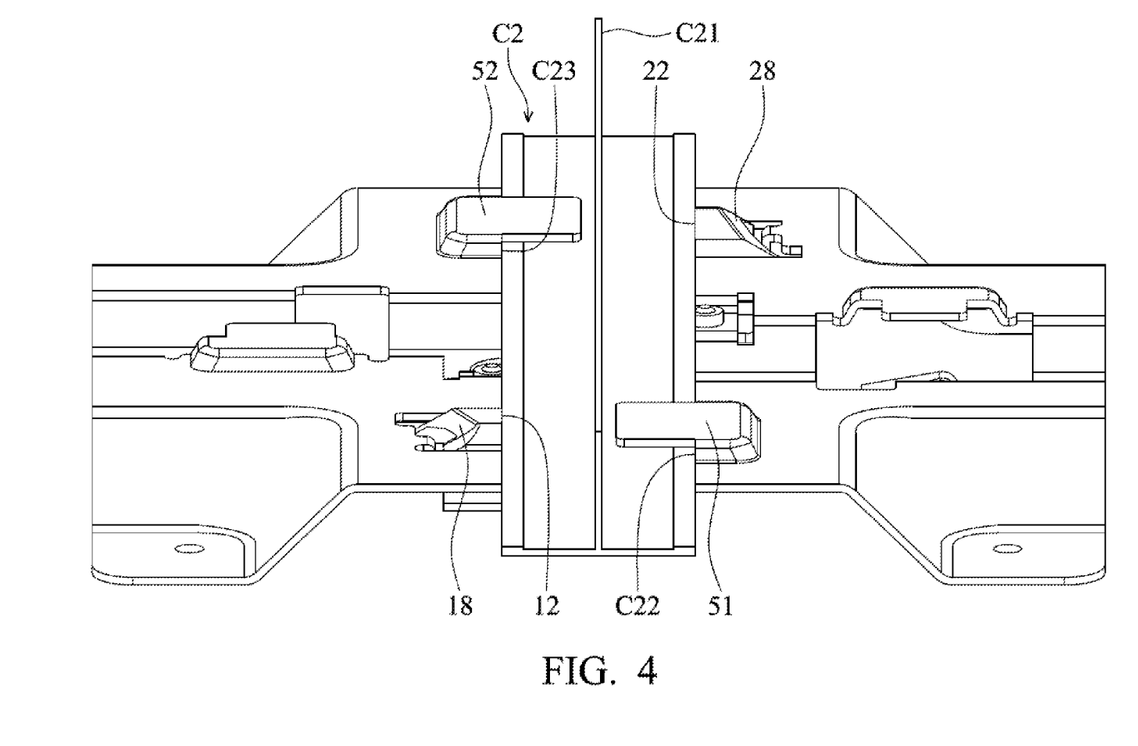
FIG. 4 shows a suspension mount of another embodiment of the invention.

With reference to FIG. 4, in a modified embodiment, the second ceiling structure C2 comprises a first side C22, a second side C23 and a central rib C21. The central rib C21 is located between the first side C22 and the second side C23, the first side C22 abuts the first fastening portion 51, and the second side C23 abuts the second fastening portion 52.

Figure 5:
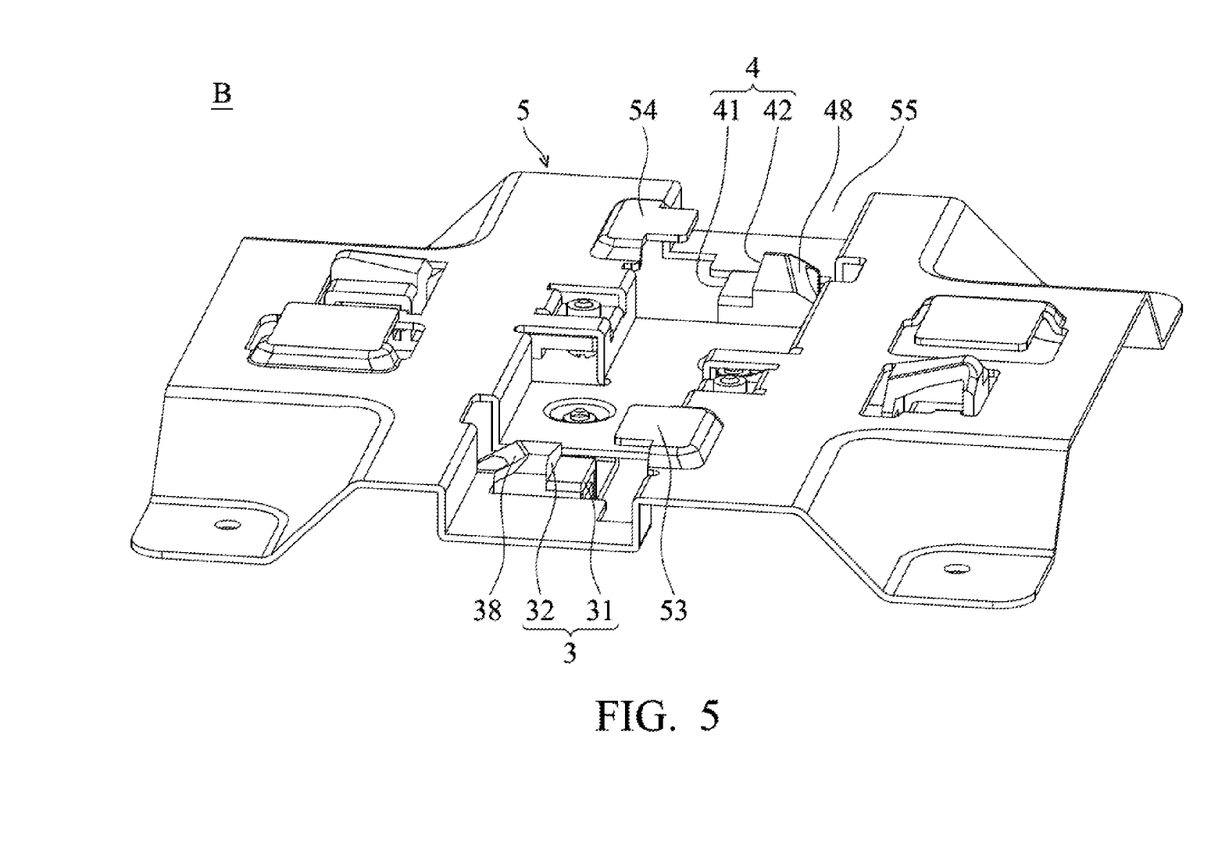
FIG. 5 shows the suspension mount of the embodiment of FIG. 1 in another visual angle.

With reference to FIG. 5, in one embodiment, the body 5 further comprises a recess 55, a third fastening portion 53, and a fourth fastening portion 54. The third fastening portion 53 is disposed on a side of the recess 55, and the fourth fastening portion 54 is disposed on the other side of the recess 55. The suspension mount B further comprises a third elastic unit 3 and a fourth elastic unit 4. The third elastic unit 3 is disposed on the body 5 and corresponds to the third fastening portion 53. The fourth elastic unit 4 is disposed on the body 5 and corresponds to the fourth fastening portion 54. The structures of the third elastic unit 3 and the fourth elastic unit 4 are similar to the structures of the first elastic unit 1 and the second elastic unit 2. In detail, the third elastic unit 3 comprises a fifth abutting portion 31 and a sixth abutting portion 32. The fifth abutting portion 31 is located between the sixth abutting portion 32 and the third fastening portion 53. The fourth elastic unit 4 comprises a seventh abutting portion 41 and an eighth abutting portion 42. The seventh abutting portion 41 is located between the eighth abutting portion 42 and the fourth fastening portion 54.

Figure 6A:
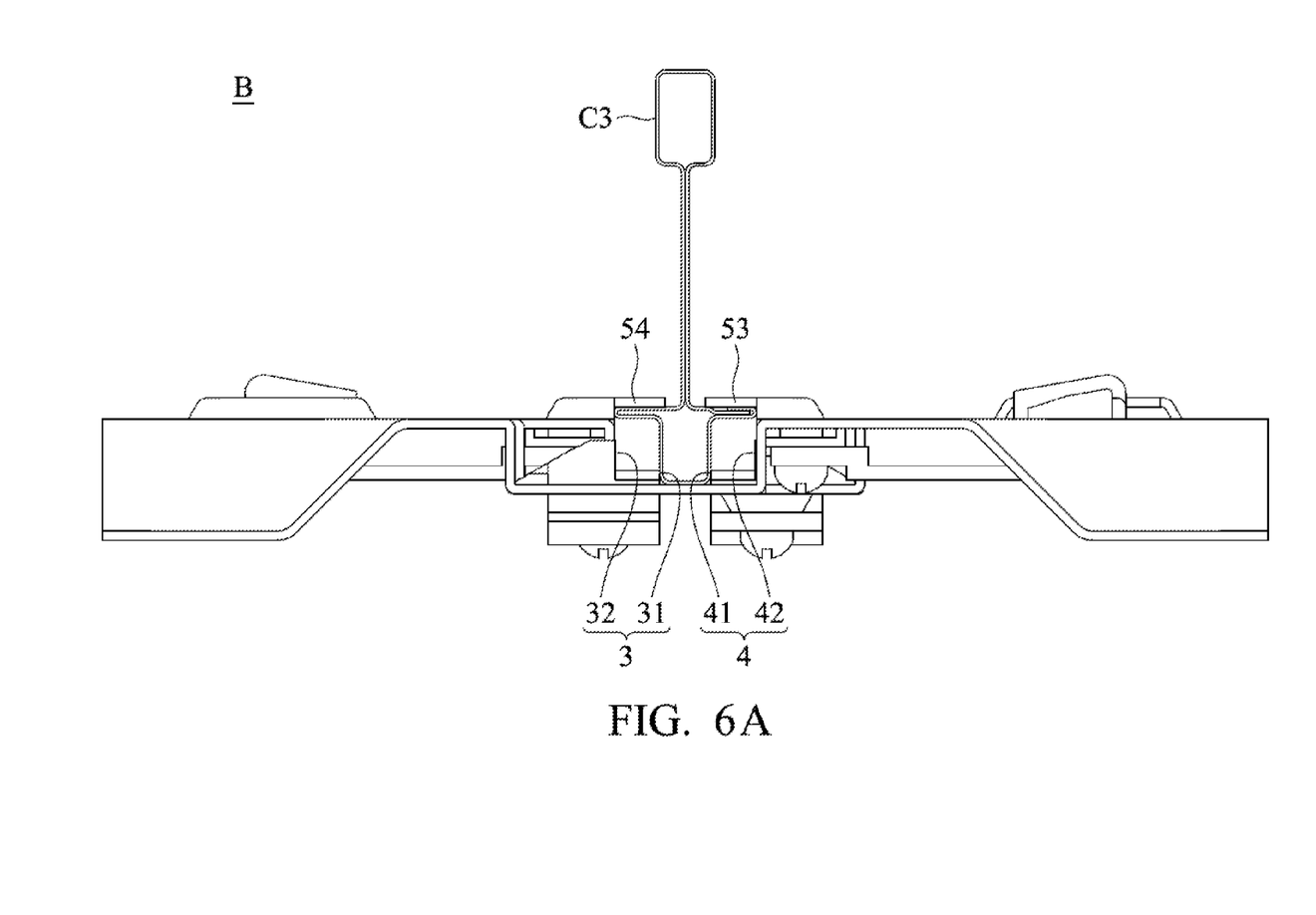
FIG. 6A shows the suspension mount of the embodiment of the invention affixed to a third ceiling structure.
Figure 6B:
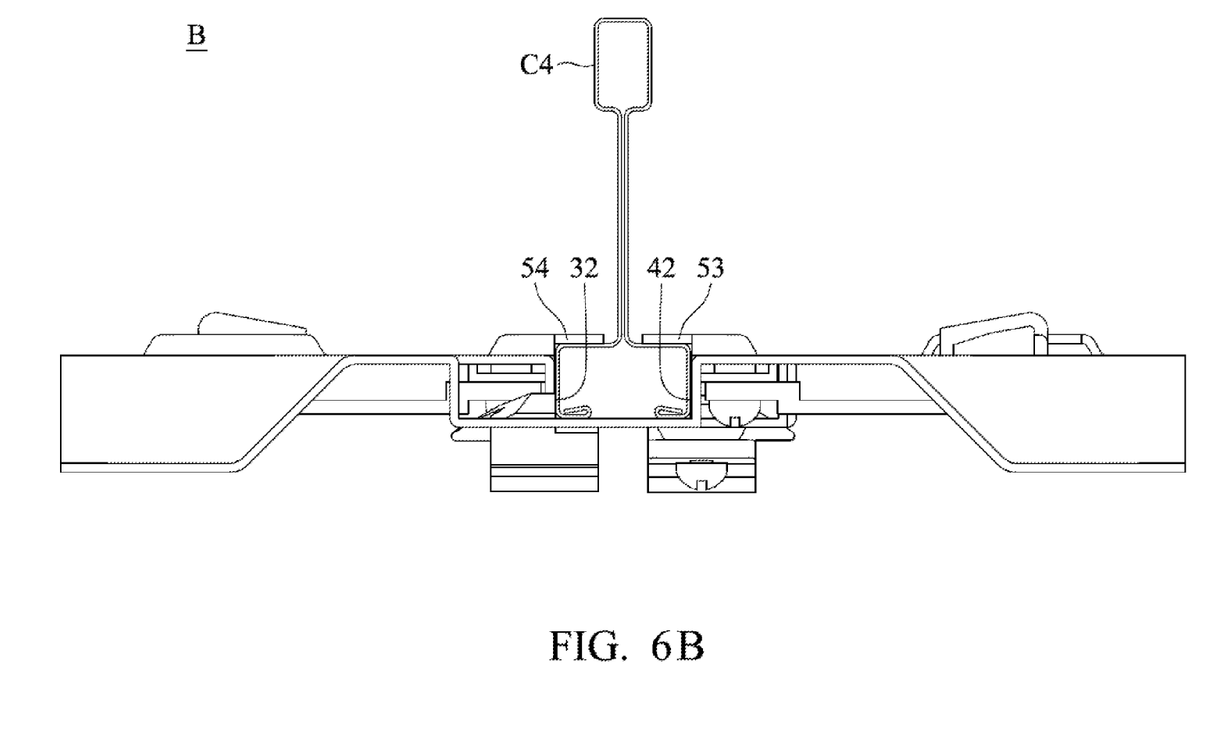
FIG. 6B shows the suspension mount of the embodiment of the invention affixed to a fourth ceiling structure.

With reference to FIGS. 6A and 6B, in one embodiment, the suspension mount B may be selectively connected to a third ceiling structure 3 or a fourth ceiling structure 4 via a recess 55, the third fastening portion 53, the fourth fastening portion 54, the third elastic unit 3, and the fourth elastic unit 4. When the suspension mount B is connected to the third ceiling structure C3, the third ceiling structure C3 is sandwiched between the fifth abutting portion 31 and the third fastening portion 53, and the third ceiling structure C3 is also sandwiched between the seventh abutting portion 41 and the fourth fastening portion 54. When the suspension mount B is connected to the fourth ceiling structure C4, the fourth ceiling structure C4 is sandwiched between the sixth abutting portion 32 and the third fastening portion 53, and the fourth ceiling structure C4 is also sandwiched between the eighth abutting portion 42 and the fourth fastening portion 54.

In the embodiment of FIGS. 6A and 6B, the elastic unit (for example, the third elastic unit) has a stair structure. Therefore, the suspension mount can be affixed to ceiling structures of different shapes by the elastic unit and the recess. Additionally, in this embodiment, an included angle is formed between an affixing direction of the first ceiling structure and an affixing direction of the third ceiling structure. In one embodiment, the included angle is 90 degrees. By arranging the fastening portions and the elastic units in different positions, the one single suspension mount can be affixed to different ceiling structures. In this embodiment, the suspension mount can be affixed to four different ceiling structures. However, the disclosure is not meant to restrict the invention. The suspension mount of an embodiment of the invention can also be affixed to more than four different ceiling structures.

Figure 7:
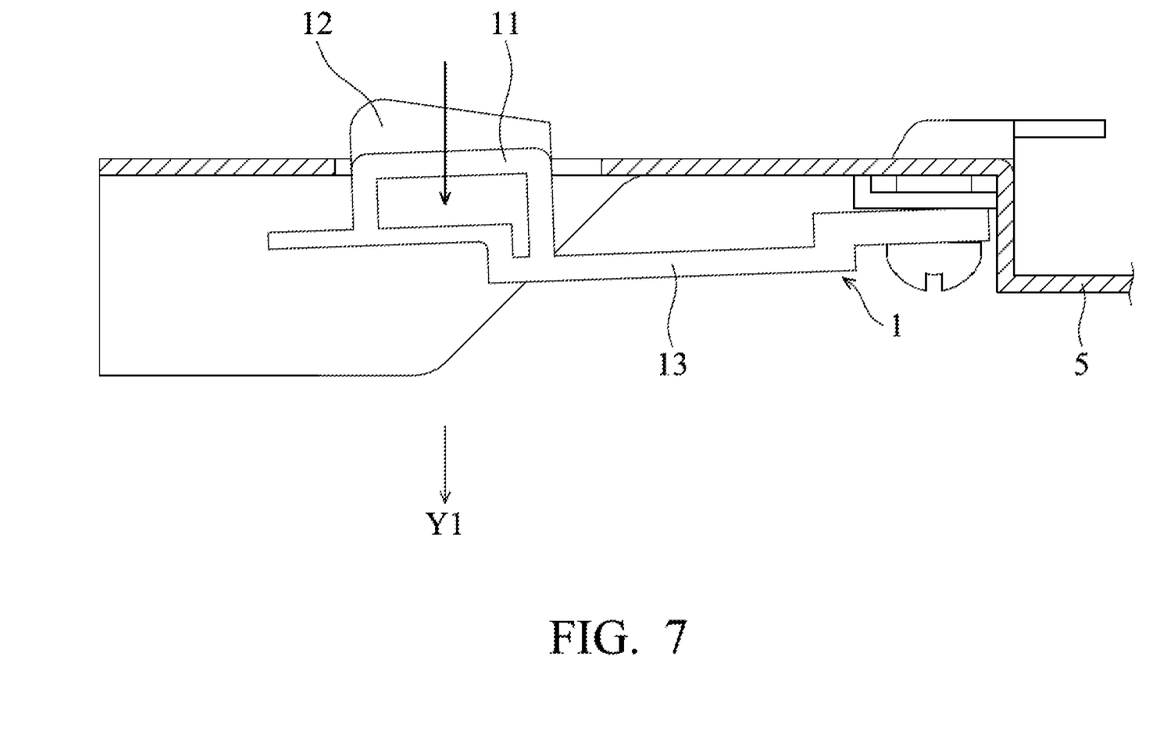
FIG. 7 shows an elastic unit of an embodiment of the invention.

FIG. 7 is a cross sectional view along A-A direction of FIG. 1. In this embodiment, the first elastic unit 1 comprises an elastic sheet 13, the elastic sheet 13 is affixed to the body 5, and the first abutting portion 11 and the second abutting portion 12 are formed on the elastic sheet 13. The elastic sheet 13 provides an upward recovery force (opposite to the third direction Y1) for the first elastic unit 1.

Figure 8:
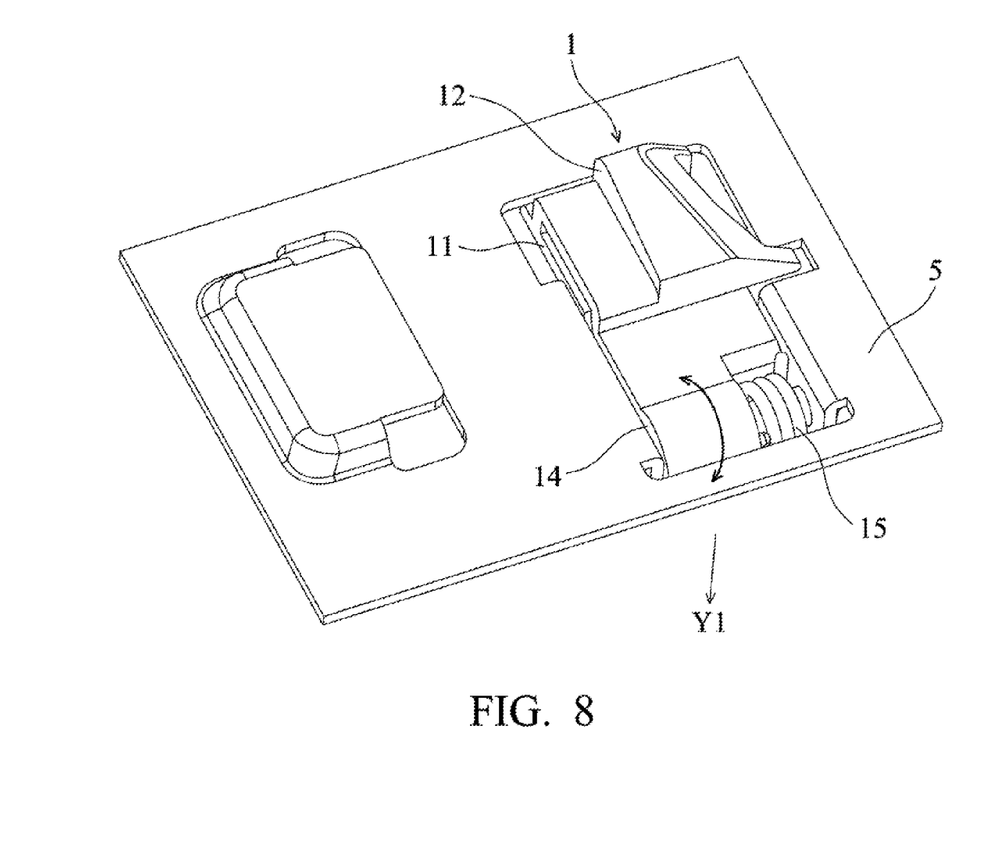
FIG. 8 shows an elastic unit of another embodiment of the invention.

With reference to FIG. 8, in another embodiment, the first elastic unit comprises a pivoting member 14 and a torsion spring 15. The torsion spring 15 is disposed between the pivoting member 14 and the body 5. The first abutting portion 11 and the second abutting portion 12 are formed on the pivoting member 14. The torsion spring 15 provides an upward recovery force (opposite to the third direction Y1) for the first elastic unit 1.

Figure 9:
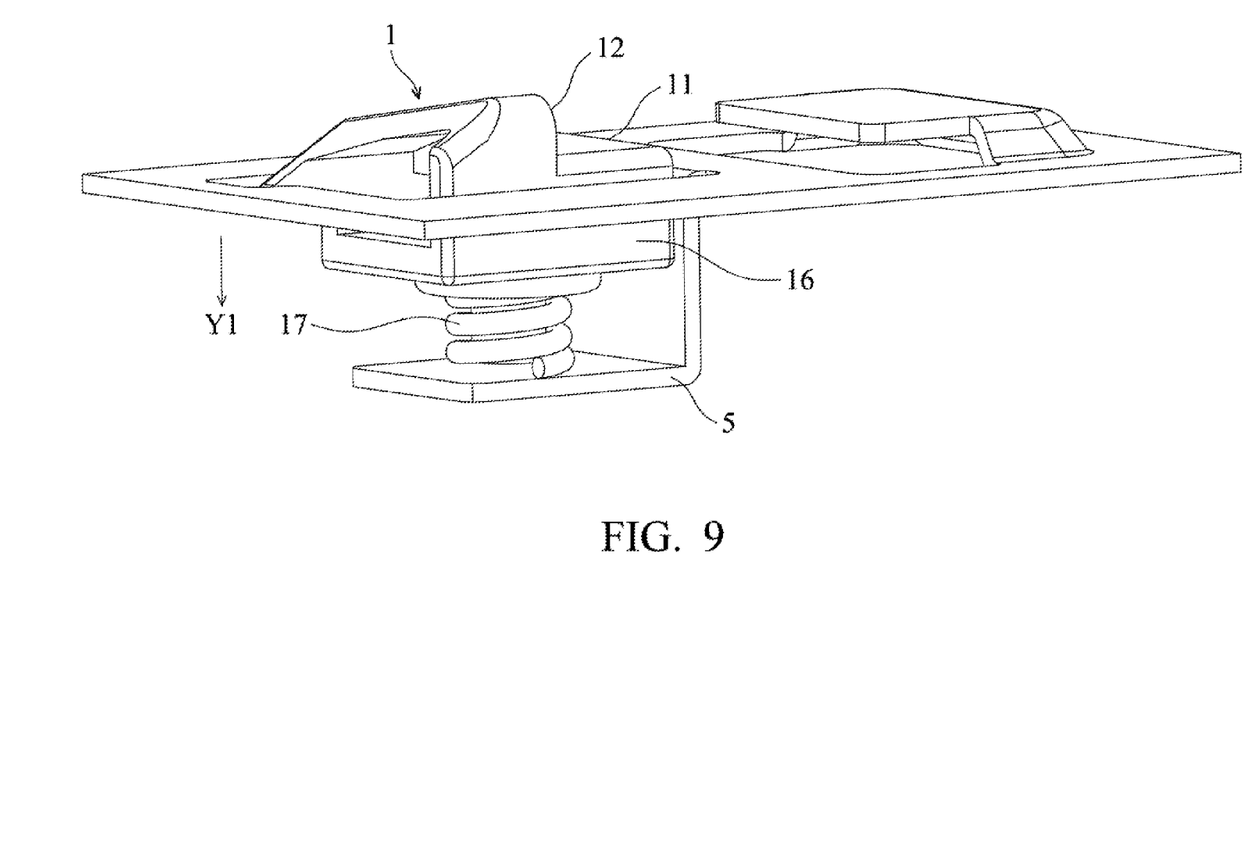
FIG. 9 shows an elastic unit of another embodiment of the invention.

With reference to FIG. 9, in another embodiment, the first elastic unit 1 comprises an abutting member 16 and a compression spring 17. The compression spring 17 is disposed between the abutting member 16 and the body 5. The first abutting portion 11 and the second abutting portion 12 are formed on the abutting member 16. The compression spring 17 provides an upward recovery force (opposite to the third direction Y1) for the first elastic unit 1.

Utilizing the suspension mount of the embodiment of the invention, the elastic units with stair structures are provided. Therefore, the suspension mount can be affixed to ceiling structures of different shapes. The design of the elastic unit can be modified to have stair structures. The disclosure is not meant to restrict the invention.

In one embodiment, the ceiling structures mentioned above are metal frames to support ceiling boards.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A suspension mount for suspending an electronic device and at least applicable to a first ceiling structure and a second ceiling structure, each of the first ceiling structure and the second ceiling structure having a first side, a second side and a central rib located between the first side and the second side, the suspension mount comprising:
    a body, comprising:
    a first fastening portion, extending toward a first direction; and
    a second fastening portion, extending toward a second direction, wherein the first direction is opposite to the second direction;
    a first elastic unit, disposed on the body and corresponding to the first fastening portion, wherein the first elastic unit comprises a first abutting portion and a second abutting portion, the first abutting portion is located between the second abutting portion and the first fastening portion; and
    a second elastic unit, disposed on the body and corresponding to the second fastening portion, wherein the second elastic unit comprises a third abutting portion and a fourth abutting portion, and the third abutting portion is located between the fourth abutting portion and the second fastening portion,
    wherein when the suspension mount is applied to the first ceiling structure, the first ceiling structure is sandwiched between the first abutting portion and the first fastening portion, and the first ceiling structure is also sandwiched between the third abutting portion and the second fastening portion, and when the suspension mount is applied to the second ceiling structure, the second ceiling structure is sandwiched between the second abutting portion and the first fastening portion, and the second ceiling structure is also sandwiched between the fourth abutting portion and the second fastening portion, and
    wherein when the suspension mount is applied to the second ceiling structure, the second ceiling structure is located above and abutted on the first abutting portion and the third abutting portion.

2. The suspension mount as claimed in claim 1, wherein the first side is abutted against the first fastening portion, and the second side is abutted against the second fastening portion.

3. The suspension mount as claimed in claim 1, wherein the first fastening portion and the second fastening portion is abutted against the central rib.

4. The suspension mount as claimed in claim 1, wherein the body further comprises a recess, a third fastening portion and a fourth fastening portion, the third fastening portion is disposed on a side of the recess, and the fourth fastening portion is disposed on the opposite side of the recess, the suspension mount further comprises a third elastic unit and a fourth elastic unit, the third elastic unit is disposed on the body and corresponds to the third fastening portion, wherein the third elastic unit comprises a fifth abutting portion and a sixth abutting portion, the fifth abutting portion is located between the sixth abutting portion and the third fastening portion, the fourth elastic unit is disposed on the body and corresponds to the fourth fastening portion, wherein the fourth elastic unit comprises a seventh abutting portion and an eighth abutting portion, and the seventh abutting portion is located between the eighth abutting portion and the fourth fastening portion.

5. The suspension mount as claimed in claim 4, wherein the suspension mount is further applicable to a third ceiling structure and a fourth ceiling structure, and when the suspension mount is applied to the third ceiling structure, the third ceiling structure is sandwiched between the fifth abutting portion and the third fastening portion, and the third ceiling structure is also sandwiched between the seventh abutting portion and the fourth fastening portion, and when the suspension mount is applied to the fourth ceiling structure, the fourth ceiling structure is sandwiched between the sixth abutting portion and the third fastening portion, and the fourth ceiling structure is also sandwiched between the eighth abutting portion and the fourth fastening portion.

6. The suspension mount as claimed in claim 5, wherein when the suspension mount is applied to the fourth ceiling structure, the fourth ceiling structure is located and abutted on the fifth abutting portion and the seventh abutting portion.

7. The suspension mount as claimed in claim 1, wherein the first elastic unit comprises an elastic sheet, the elastic sheet is affixed to the body, and the first abutting portion and the second abutting portion are formed on the elastic sheet.

8. The suspension mount as claimed in claim 1, wherein the first elastic unit comprises a pivoting member and a torsion spring connected to the pivoting member and the body, the torsion spring is configured to provide a recovery force to the pivoting member, and the first abutting portion and the second abutting portion are formed on the pivoting member.

9. The suspension mount as claimed in claim 1, wherein the first elastic unit comprises an abutting member and a compression spring, the compression spring is abutted between the abutting member and the body, the compression spring is configured to provide a recovery force to the abutting member, and the first abutting portion and the second abutting portion are formed on the abutting member.

10. The suspension mount as claimed in claim 1, wherein the first elastic unit further comprises a first inclined surface, the second elastic unit further comprises a second inclined surface, the second abutting portion is located between the first inclined surface and the first abutting portion, and the fourth abutting portion is located between the second inclined surface and the third abutting portion.

11. A suspension mount for suspending an electronic device and at least applicable to a first ceiling structure, a second ceiling structure, and a third ceiling structure, each of the first, the second, and the third ceiling structure having a first side, a second side and a central rib located between the first side and the second side, the suspension mount comprising:
a body, comprising:
  a first fastening portion, extending toward a first direction; and
  a second fastening portion, extending toward a second direction, wherein the first direction is opposite to the second direction;
a first elastic unit, disposed on the body and corresponding to the first fastening portion, wherein the first elastic unit comprises a first abutting portion and a second abutting portion, the first abutting portion is located between the second abutting portion and the first fastening portion; and
a second elastic unit, disposed on the body and corresponding to the second fastening portion, wherein the second elastic unit comprises a third abutting portion and a fourth abutting portion, and the third abutting portion is located between the fourth abutting portion and the second fastening portion;
wherein the body further comprises a recess, a third fastening portion and a fourth fastening portion, the third fastening portion is disposed on a side of the recess, and the fourth fastening portion is disposed on the opposite side of the recess, the suspension mount further comprises a third elastic unit and a fourth elastic unit, the third elastic unit is disposed on the body and corresponds to the third fastening portion, and the fourth elastic unit is disposed on the body and corresponds to the fourth fastening portion,
wherein when the suspension mount is applied to the first ceiling structure, the first ceiling structure is sandwiched between the first abutting portion and the first fastening portion, and the first ceiling structure is also sandwiched between the third abutting portion and the second fastening portion, and when the suspension mount is applied to the second ceiling structure, the second ceiling structure is sandwiched between the second abutting portion and the first fastening portion, and the second ceiling structure is also sandwiched between the fourth abutting portion and the second fastening portion, and when the suspension mount is applied to the third ceiling structure, the third ceiling structure is sandwiched between the third elastic unit and the third fastening portion, and the third ceiling structure is also sandwiched between the fourth elastic unit and the fourth fastening portion, and
wherein when the suspension mount is applied to the second ceiling structure, the second ceiling structure is located above and abutted on the first abutting portion and the third abutting portion.

12. The suspension mount as claimed in claim 11, wherein an included angle is formed between the tangential direction of the affixing direction of the first ceiling structure and the tangential direction of the affixing direction of the third ceiling structure, and the included angle is 90 degrees.

13. The suspension mount as claimed in claim 11, wherein the first elastic unit comprises an elastic sheet, the elastic sheet is affixed to the body, and the first abutting portion and the second abutting portion are formed on the elastic sheet.

14. The suspension mount as claimed in claim 11, wherein the first elastic unit comprises an abutting member and a compression spring, the compression spring is abutted between the abutting member and the body, the compression spring is configured to provide a recovery force to the abutting member, and the first abutting portion and the second abutting portion are formed on the abutting member.

15. The suspension mount as claimed in claim 11, wherein the first elastic unit further comprises a first inclined surface, the second elastic unit further comprises a second inclined surface, the second abutting portion is located between the first inclined surface and the first abutting portion, and the fourth abutting portion is located between the second inclined surface and the third abutting portion.

16. An electronic device, comprising:
   a housing; and
   a suspension mount for suspending an electronic device and at least applicable to a first ceiling structure and a second ceiling structure, each of the first ceiling structure and the second ceiling structure having a first side, a second side and a central rib located between the first side and the second side, the suspension mount comprising:
   a body, comprising:
   a first fastening portion, extending toward a first direction; and
   a second fastening portion, extending toward a second direction, wherein the first direction is opposite to the second direction;
   a first elastic unit, disposed on the body and corresponding to the first fastening portion, wherein the first elastic unit comprises a first abutting portion and a second abutting portion, the first abutting portion is located between the second abutting portion and the first fastening portion; and
   a second elastic unit, disposed on the body and corresponding to the second fastening portion, wherein the second elastic unit comprises a third abutting portion and a fourth abutting portion, and the third abutting portion is located between the fourth abutting portion and the second fastening portion,
   wherein when the suspension mount is applied to the first ceiling structure, the first ceiling structure is sandwiched between the first abutting portion and the first fastening portion, and the first ceiling structure is also sandwiched between the third abutting portion and the second fastening portion, and when the suspension mount is applied to the second ceiling structure, the second ceiling structure is sandwiched between the second abutting portion and the first fastening portion, and the second ceiling structure is also sandwiched between the fourth abutting portion and the second fastening portion, and when the suspension mount is applied to the third ceiling structure, the third ceiling structure is sandwiched between the third elastic unit and the third fastening portion, and the third ceiling structure is also sandwiched between the fourth elastic unit and the fourth fastening portion, and
   wherein when the suspension mount is applied to the second ceiling structure, the second ceiling structure is located above and abutted on the first abutting portion and the third abutting portion.

\* \* \* \* \*